United States Patent [19]

Thomas et al.

[11] Patent Number: 4,670,091

[45] Date of Patent: Jun. 2, 1987

[54] PROCESS FOR FORMING VIAS ON INTEGRATED CIRCUITS

[75] Inventors: Michael E. Thomas, Cupertino; Robert L. Brown, Palo Alto, both of Calif.

[73] Assignee: Fairchild Semiconductor Corporation, Palo Alto, Calif.

[21] Appl. No.: 843,328

[22] Filed: Mar. 24, 1986

Related U.S. Application Data

[63] Continuation-in-part of Ser. No. 644,028, Aug. 23, 1984, abandoned.

[51] Int. Cl.[4] .................... C23F 1/02; B44C 1/22; C03C 15/00; C03C 25/06
[52] U.S. Cl. .................... 156/643; 156/644; 156/646; 156/652; 156/653; 156/656; 156/657; 156/659.1; 156/901; 204/192.35
[58] Field of Search ............ 156/643, 644, 646, 652, 156/653, 656, 657, 659.1, 661.1, 662, 668, 901, 902; 29/591; 357/65, 71; 427/88–90; 204/192 EC, 192 E; 252/79.1; 174/68.5

[56] References Cited

U.S. PATENT DOCUMENTS

| | | | |
|---|---|---|---|
| 2,731,333 | 1/1956 | Ko et al. ............... | 156/661.1 X |
| 3,489,656 | 1/1970 | Balde .................... | 204/15 |
| 3,679,941 | 7/1972 | LaCombe et al. ....... | 156/661.1 X |
| 3,756,887 | 9/1973 | Cruthers ............... | 156/656 X |
| 3,904,461 | 9/1975 | Estep et al. ............ | 156/11 |
| 4,172,004 | 10/1979 | Alcorn et al. .......... | 156/643 |
| 4,410,622 | 10/1983 | Dalal et al. ............ | 430/312 |

FOREIGN PATENT DOCUMENTS

0129389 12/1984 European Pat. Off. .

OTHER PUBLICATIONS

IBM Technical Disclosure Bulletin, vol. 19, No. 9, Feb. 1977, pp. 3364–3365, New York, US; W. C. Metzger et al.: "Forming Planar Integrated Circuit Metallization". Journal of the Electromechanical Society, vol. 131, No. 1, Jan. 1984, pp. 115–120, Manchester, US; C. C. Tang et al.: "Tungsten Etching in CF4 and SF6 Discharges".
"A Novel Planar Multilevel Interconnection Technology Utilizing Polyimide" by Sato et al, vol. PHP-9, No. 3, 9/73, pp. 176–180. IEEE Transactions on Parts, Hybrids, and Packaging.
"Pillars—The Way to Two Micron Pitch Multilevel Metallization" by Oakley et al, June 21–22, 1984, V-MIC Conference, pp. 23–29.

*Primary Examiner*—William A. Powell
*Attorney, Agent, or Firm*—Carl L. Silverman; David H. Carroll; William H. Murray

[57] ABSTRACT

In a process of forming vias for multilevel interconnects used in integrated circuits, a layer of a first metal is formed on a semiconductor substrate. A layer of a second metal is formed on the first metal layer. The second metal layer is etched in a predetermined via pattern with a second etchant which reacts with the second metal and which is substantially unreactive with the first metal. The first metal layer is then etched with a first etchant which reacts with the first metal and which is substantialy unreactive with the second metal or with the semiconductor substrate in order to form a predetermined contacting relationship with the predetermined via pattern. This process may be used to generate second and subsequent levels of vias and interconnects which can be used to contact metal layer at any level directly to the substrate by building via posts from the substrate to any desired metal layer.

20 Claims, 35 Drawing Figures

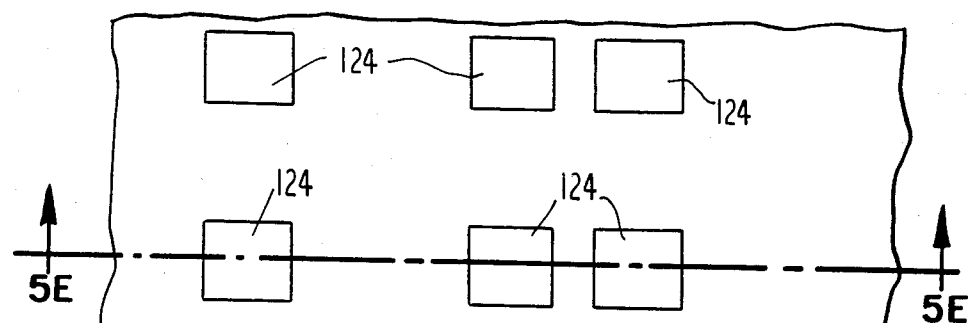
_Fig. 10_
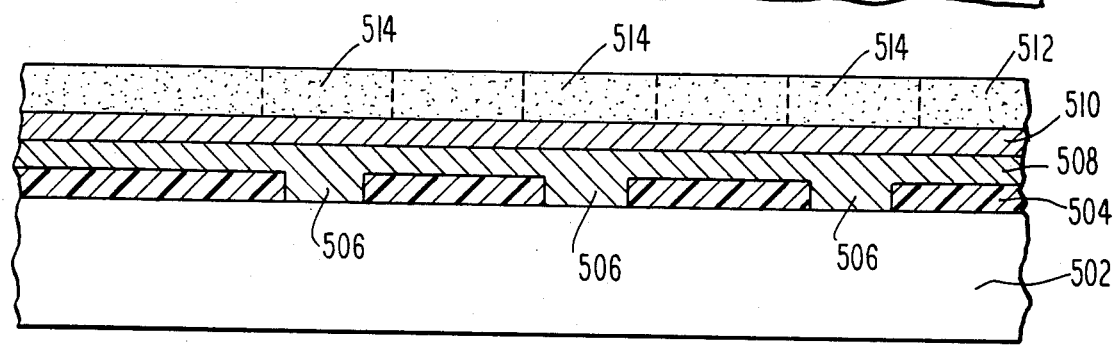
_Fig. 11A_
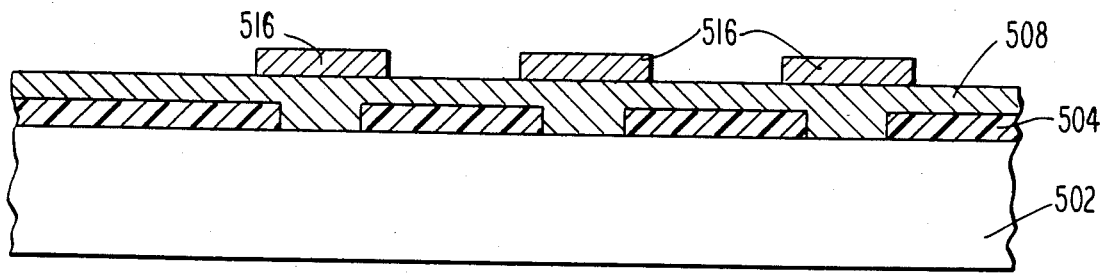
_Fig. 11B_
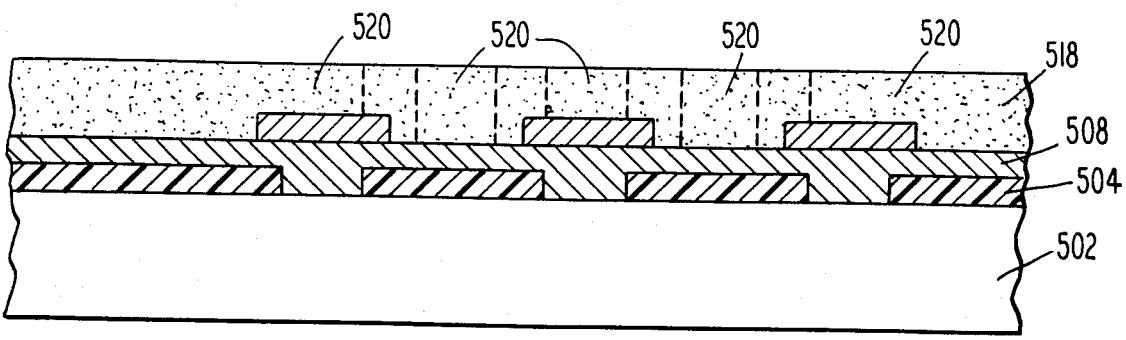
_Fig. 11C_

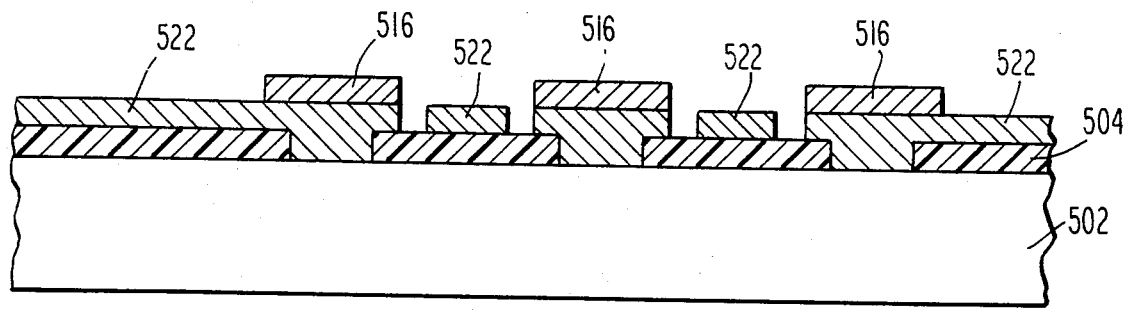
_Fig. 11D_
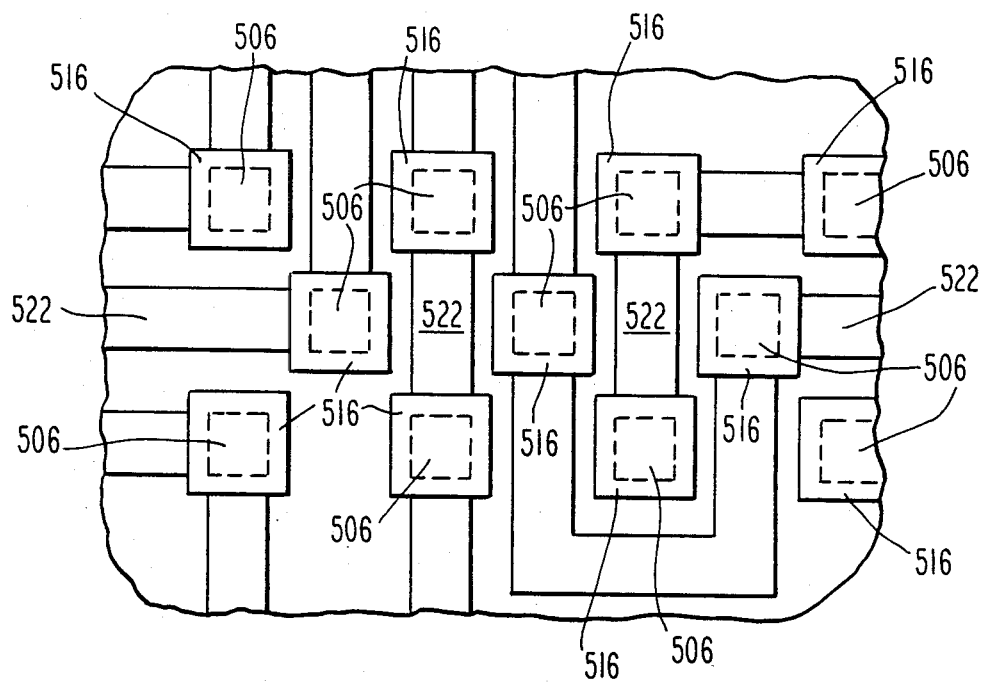
_Fig. 12_

PROCESS FOR FORMING VIAS ON INTEGRATED CIRCUITS

This application is a continuation-in-part of co-pending U.S. patent application Ser. No. 644,028, filed Aug. 23, 1984, now abandoned.

BACKGROUND OF THE INVENTION

This invention is related to the fabrication of multilevel interconnects for integrated circuits and more particularly to the formation of vias for selectively providing electrical interconnections between selected levels of the multilevel structure.

Integrated circuits include a multiplicity of semiconductor devices which are disposed substantially co-planar with respect to one another on a silicon wafer. In order to have a functioning circuit, it is necessary to electrically interconnect the electrical contact regions of these devices. Electrical interconnections, depending on the complexity of the circuit, may require duplication of devices, extensive or complex routing of the interconnects, or both. Such requirements adversely affect circuit densification by utilizing more area than would be necessary if the interconnects were able to be routed without consideration of overlapping metal lines.

It is of course possible to route interconnects over one another without making contact by constructing multilevel integrated circuit devices comprising two or more levels of interconnects separated by a dielectric layer. When constructing such devices, vertical interconnects, sometimes known as vias, are required in order to route signals and signal returns from one level of planar interconnects to another.

As device densification of the integrated circuits becomes greater, alignment of metal to contacts and vias becomes more and more citical. This is due to the fact that greater device density necessarily causes a concomitant increase in contact and interconnect density. Consequently, when it is required to electrically connect a particular contact or interconnect disposed on the substrate to a particular interconnect on the next higher level or to electrically connect two particular interconnects between levels, precise alignment of the vias is mandatory. Misalignment could cause unwanted short circuits between interconnects or between a contact and an interconnect.

In addition to short circuits, a misalignment may also create a marginal electrical contact between the via and the interconnect thereby creating a region of increased current density, a defect which can be potentially fatal to the operation of the circuit. Furthermore, utilizing the prior art technique of via formation which entails deposition of the via material into an aperture etched through the dielectric material separating the interconnect levels, misalignment of the via apertures may cause over etching of the dielectric down to the proximity of the surface of the semiconductor substrate, if not actually into the substrate. Subsequent deposition of the via metal into the aperture could then create defects due to punch through or contamination of the substrate material.

One method of compensating for via misalignment consists of forming pads or nests which are enlargements of the width of the planar interconnects at the approximate via locations. Consequently, the larger the pad or nest, the greater the via misalignment which can be tolerated. Creation of such pads or nests itself has an adverse affect on densification since these enlarged portions of the interconnect preclude closer spacing between interconnects.

Furthermore, placing a metal interconnect line across a contact hole exposing a device contact region, allowance must be made for possible misalignment of the metal line position with respect to the hole, so that the hole will not be uncovered and partially, or even fully in extreme misalignments, exposed to the etches that are used to create the metal interconnect line pattern. This has required in the past that the the metal line width in the vicinity of the hole include a certain fraction of width beyond the electrical requirements of the interconnect line, this fraction being at least equal to the expected maximum misalignment of the line.

This additional width increases the minimum line center to line center spacing that is possible in laying out geometries of the metal interconnection lines. This may be shown by referring to FIG. 13 which depicts metal structures that schematically represent present requirements. As shown in FIG. 13, a "dog bone" structure 702, which is an enlargement of the interconnect line 704, is designed to completely surround the contact region 706 by overlying metal in order to ensure that the contact region 706 is not exposed to etchant used to form the interconnect lines 704. Consequently, the line center to line center distance is equal to $W/2+a+d+W/2$; where w is the required width of a metal interconnect line, a is the misalignment allowance, and d is the required separation of the metal lines. Consequently, it can be seen that the misalignment allowance, a, increases the necessary line to line spacing.

Accordingly, it is an object of the present invention to provide a method for forming vertical interconnects in multilevel metallization for integrated circuits which are substantially self aligning.

Another object of the present invention is to provide a method of forming vertical interconnects in a multilevel metallization for integrated circuits which permits enhanced densification of devices within the circuit.

It is a further object of the present invention to provide a method for forming vertical interconnects between levels of a multilevel metallization for integrated circuits which enhances reliability of the vertical connection.

It is yet another object of the present invention to provide a method for forming vertical interconnects between levels of a multilevel metallization for integrated circuits while minimizing defects caused by via misalignment.

It is still another object of the present invention to improve misalignment tolerance of metal to contact in integrated circuit structures It is yet a further object of the present invention to permit closer spacing of interconnect lines and enable increased device density.

It is another object of the present invention to increase the yield of vias and contacts.

SUMMARY OF THE INVENTION

The present invention comprises a process for forming posts in an integrated circuit which includes a semiconductor substrate having an insulating layer formed thereover. The insulating layer has at least one device contact region defined therein. A layer of a first metal, which is reactive to a first etchant and not a second etchant, is formed on the insulating layer and into the device contact regions. A layer of a second metal, which is reactive to the second etchant but not the first etchant, is formed on the first metal layer. The second metal layer is then masked as required to form a predetermined post pattern with at least one defined post having an area which is at least equal to the area of the underlying device contact region and which is substantially aligned therewith in covering spacial relationship thereto. The posts are then formed by etching the unmasked portions of the second metal layer. Since the first metal layer is not reactive to the second etchant, etching will stop at the surface of the first metal layer. The first metal layer is then masked to form the desired interconnect pattern. The first metal layer is then etched using the first etchant. Since the second metal layer is non-reactive to the first etchant, the posts which were formed in the second metal layer are unaffected by the first etchant and furthermore serve as masks on the first metal layer thereby creating precise alignment between the posts constructed of the second metal with the interconnects constructed of the first metal and with the underlying device contact regions.

BRIEF DESCRIPTION OF THE DRAWINGS

FIG. 10 is a top plan view of a segment of an integrated circuit as depicted in cross-section in FIG. 5E.

FIGS. 11A through 11D illustrate sequential cross-sectional view of still another fabrication scheme for an integrated circuit employing another alternate preferred embodiment of the present invention.

FIG. 12 is a top plan view of a segment of an integrated circuit as depicted in cross-section in FIG. 11D.

DESCRIPTION OF THE PREFERRED EMBODIMENT

Figure 1A:
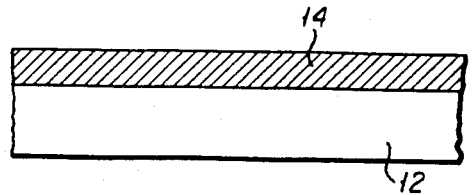
FIGS. 1A through 1H depict sequential cross-sectional views of one fabrication scheme for an integrated circuit employing a preferred embodiment of the method of the present invention.
Figure 1B:
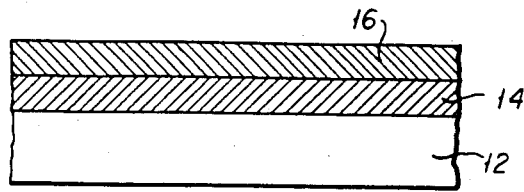
Figure 1C:
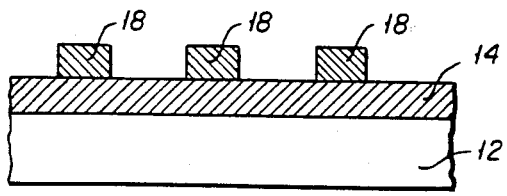

Referring to FIG. 1A, there is shown a substrate 12 having a first layer 14 of a first metal formed thereon by conventional means such as sputtering, physical vapor deposition (PVD), or chemical vapor deposition (CVD). Although the first metal may be any metal which conducts electricity and which reacts with at least one etchant and the thickness of this first layer 14 may range from hundreds of angstroms to ten microns or more; in the preferred embodiment, the first metal 14 is either tungsten or aluminum and the thickness of the layer is substantially equal to 7,500 Å. As shown in FIG. 1B, a second layer 16 of a second metal is formed on the first layer 14 by conventional means such as sputtering, PVD, or CVD. Although the second metal may be any metal which conducts electricity, it is preferred that the second metal be aluminum if the first metal is tungsten or that the second metal be tungsten if the first metal is aluminum. Furthermore, although the thickness of this second layer 16 may range from hundreds of angstroms to ten microns or more; it is preferred that the second layer have a thickness typically equal to the first metal layer. Consequently, in the preferred embodiment, the thickness of the second layer 16 is substantially equal to 7,500 Å.

Following the formation of the second metal layer 16 on the first metal layer 14, a desired pattern of vertical posts or vias is defined over the second metal layer 16 using any compatible masking technique; for example, optical imaging of a pattern into photoresist. After the desired via pattern is formed, the second metal layer 16 is then etched, using an etchant which reacts with the second metal and not with the first metal in any substantial manner. Preferably, an anisotropic etch process is used to define these structures. Where the second metal is aluminum and the first metal is tungsten, a chlorine based dry etchant is utilized. Where the second metal layer is tungsten and the first metal layer is aluminum, a fluorine based dry etchant is utilized. The photoresist mask allows the etching process to produce a pattern of vias in accordance with the predetermined masked pattern. Since the first metal does not react with the second etchant, the etching process stops at the upper surface of the first metal layer 14.

Figure 1D:
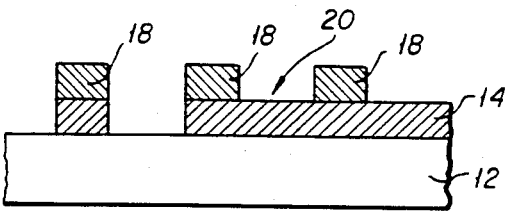
Figure 2:
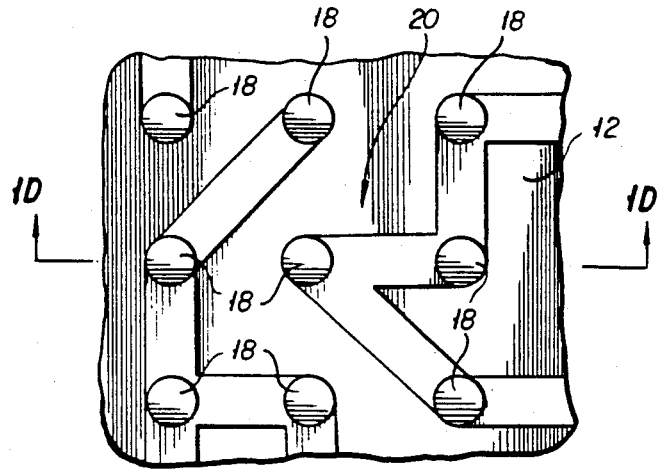
FIG. 2 is a top plan view of a segment of an integrated circuit as depicted in cross-section in FIG. 1D.

Following the formation of vias 18, and removal of the photoresist used to define them, a second layer of a photoresist material is disposed on the first metal layer 14 and defined pattern of via posts. The photoresist is then exposed in accordance with a predetermined interconnect pattern. The exposed photoresist pattern masks the first metal layer 14 against the first etchant in accordance with conventional photoresist etching procedures. The unprotected regions of the first metal layer 14 are then etched with the first etchant which selectively removes the first metal while not affecting the vias 18 which are formed of the second metal. Consequently, the first metal layer 14 is etched around the photoresist mask pattern as well as around the vias 18 down to the substrate 12, thereby forming the desired interconnect pattern 20 with the vias 18 disposed thereon (see FIG. 2 and 1D which is a sectional elevational view taken along line 1D—1D of FIG. 2).

Since the vias 18 are unaffected by the first etchant, they act as masks which prevents the first etchant from etching the first metal disposed immediately underneath the vias. Consequently, it can be seen that even if the vias are misaligned with respect to the interconnect pattern, the interconnects will automatically be extended to coincide with the boundaries of the misaligned via thereby creating a contact area which is substantially coextensive with the bottom surface area of each via.

If the vias were formed through apertures which are created by non-selective etching through the dielectric layer and not properly aligned, it is quite possible that the dielectric could be etched down through the misaligned area possibly as far as the substrate. In this case, the via hole would expose the substrate to subsequent metal deposition which could catastrophically affect the device. Eve if the etch does not expose the substrate, there still remains the possibility of dielectric failure by electrical breakdown and poor metal step coverage into this region.

Figure 1E:
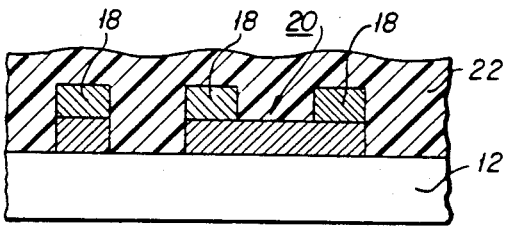
Figure 1F:
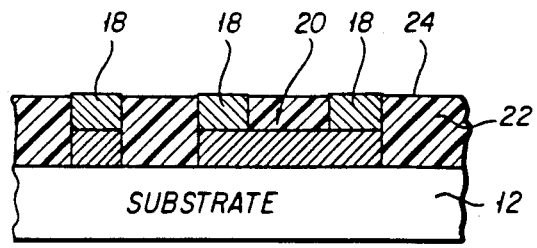
Figure 3:
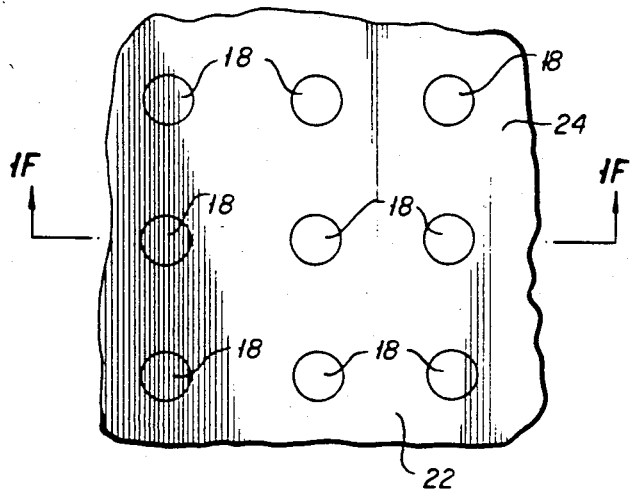
FIG. 3 is a top plan view of a segment of an integrated circuit as depicted in cross-section in FIG. 1F.

After formation of the vias 18 on the desired interconnect pattern 20, a layer of dielectric 22 is formed on the substrate 12, covering the interconnects 20 and the vias 18, as shown in FIG. 1E. The dielectric layer preferably comprises silicon dioxide and is formed by CVD or sputtering to a thickness typically equal to 2 microns. The dielectric layer 22 is then etched back to form a substantially planar surface 24 which exposes the tops of the vias 18, as shown in FIGS. 3 and 1F, which is a cross-section of FIG. 3 taken along lines 1F—1F. The dielectric etchant is typically fluorine based which has a suitable selectivity of the dielectric over the via post metal.

Figure 1G:
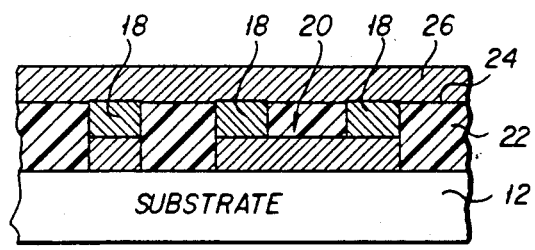

A third layer 26 of the first metal is formed on the surface 24 as shown in FIG. 1G. Prior to the deposition of this layer, if the second metal is aluminum, the exposed tops of the vias 18 (see FIG. 3) should be sputter cleaned to remove any aluminum oxide which may have formed thereon. Since alumium oxide is an electrical insulator, any aluminum oxide formation which remains on the exposed tops of the vias 18 immediately before the next level of metallization is deposited can degrade or even destroy the electrical contact required between the via and the overlying metallization. As a result, any aluminum oxide formation which is not removed during sputter cleaning can cause defective contacts and/or via chains thereby causing a diminution in yield. Consequently, selection of tungsten as the second metal for posts provides an added advantage of the present invention in that undesired oxide formation is minimal, therefore eliminating the necessity of the sputter cleaning step and the concomittant possibly of a reduction in yield.

Figure 1H:
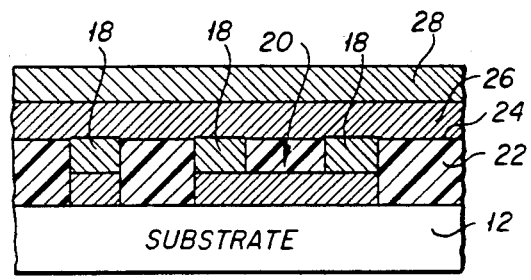

The third layer 26 is formed by conventional deposition techniques such as PVD and CVD and has a thickness typically equal to 7,500 Å. As shown in FIG. 1H, a fourth layer 28 of the second metal is formed on the third layer 26 by the conventional metallization techniques described previously. The process used to generate the first set of interconnects and vias may be used to define a second set of interconnects and vias. The number of levels that can be generated by this method is substantially unlimited and can be used to connect metal layers at any level directly to the substrate by building via posts from the substrate to any desired metal layer.

The final interconnect level can be constructed by forming a single layer of the first metal over the exposed top surfaces of the underlying vias which layer is then etched in accordance with a predetermined pattern exposed in a layer of photoresist as is known in the art. This final level can then be coated with a dielectric for scratch protection in the conventional manner in order to complete the multilevel structure.

Figure 4A:
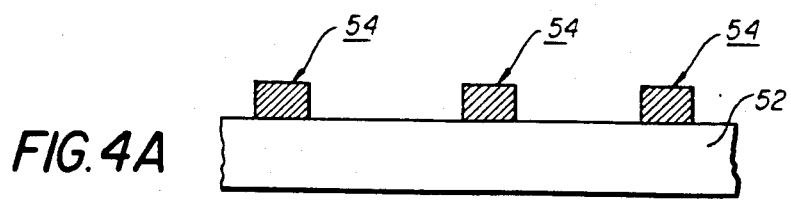
FIGS. 4A through 4G illustrate sequential cross-sectional views of another fabrication scheme for an integrated circuit employing an alternate preferred embodiment of the method of the present invention.
Figure 4B:
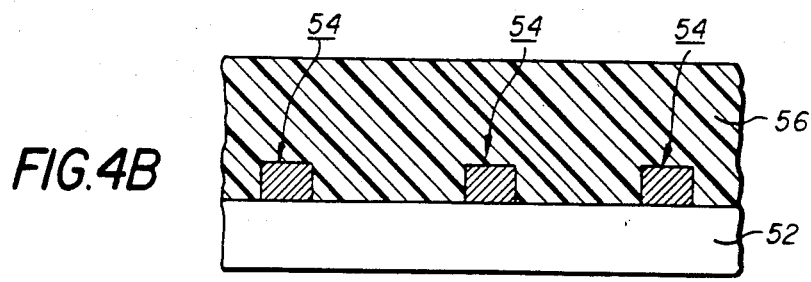
Figure 4C:
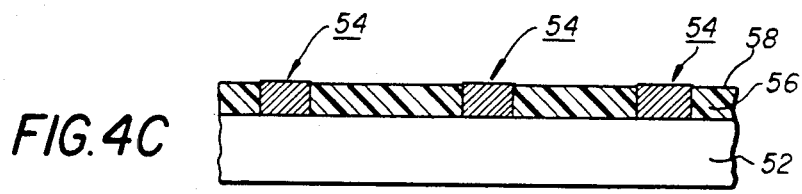

Referring now to FIGS. 4A through 4G, there is shown another fabrication scheme for multilevel interconnects employing an alternate preferred embodiment of the method of the present invention. FIG. 4A shows a substrate 52 having a predetermined interconnect pattern 54 formed on an upper surface thereof. The interconnects are electrically conductive and preferably constructed of aluminum alloys or refractory metals and are formed in the predetermined pattern using any compatible masking technique; for example, optical imaging of the pattern into photoresist. As shown in FIG. 4B, a layer of thermal nitride 56 is formed on the upper surface of the substrate 52 over the patterned metal features 54. It is preferred that this thermal nitride be silicon nitride which is formed by conventional deposition techniques to a thickness which is typically equal to 20,000 Å. The nitride is planarized as shown in FIG. 4C using an etchback planarization process as is known to those skilled in the art.

Figure 4D:
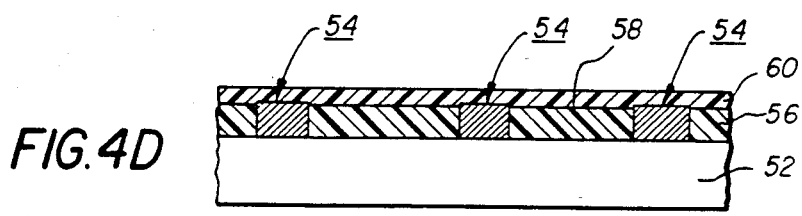

Next, as shown in FIG. 4D, a dielectric layer 60 is formed on the surface 58 of the thermal nitride layer 56 over the exposed tops of the metal topography 54. It is preferred that the dielectric layer 60 comprise a silicon dioxide material which is formed to a thickness of approximately 3,000 –15,000 Å . A using conventional deposition techniques. The preferred range of thickness for layer 54 is 3,000 Å–5,000 Å.

Figure 4E:
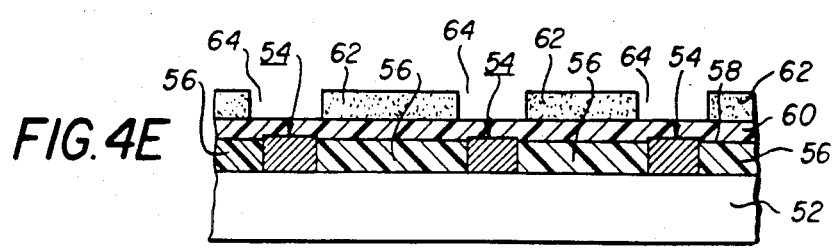
Figure 4F:
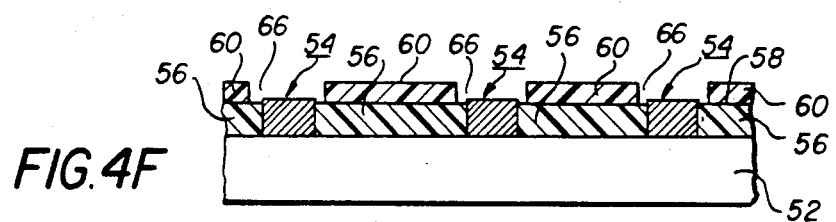

Next, as shown in FIG. 4E, a layer of photoresist material 62 is formed on the dielectric layer 60 and is masked and patterned using conventional photoresist techniques to form a plurality of via apertures 64. The silicon dioxide layer 60 is etched through the aperture 64 down to the top surface of the thermal nitride layer 56 preferably using a conventional wet etch technique and an etching solution, preferably an HF bearing solution, which will etch through the silicon dioxide layer but will stop on the metal and nitride layers. Although a wet etch technique is preferred, a plasma etch might be used instead. As a result of this etching step, via apertures 66 are formed through the silicon dioxide layer 60 down to the upper surface of the metal topography 54 and the upper surface 58 of the thermal nitride layer 56, as shown in FIG. 4F. Also this second dielectric enhances device reliability by filling in any pinholes in the film. Although the dielectric materials used in the alternate preferred embodiment described above are silicon nitride and silicon dioxide, it should be noted that any two dielectrics which have an appreciable wet or dry etch selectivity, one over the other, can be used and such are considered to be within the scope of the present invention.

Figure 4G:
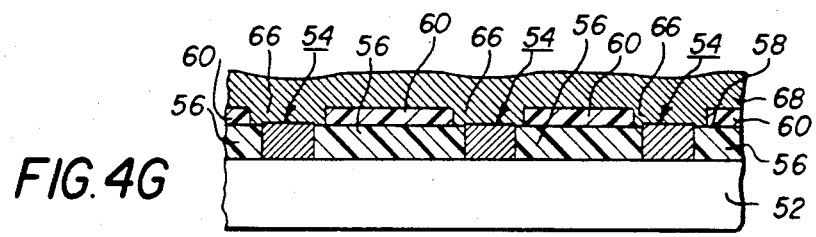

Next, it is preferred that the exposed metal contacts of the metal topography 54 be lightly sputter etched to remove any interfacial insulating layers and ensure the creation of clean contact openings just prior to the deposition of the next metal layer. Next, as shown in FIG. 4G, a metal layer 68 is formed over the silicon dioxide layer 60 and into the via apertures 66, by conventional deposition techniques. It is preferred that the metal layer 68 be comprised of aluminum or aluminum alloys and be formed to a thickness substantially equal to 8,000 Å. This is then conventionally masked and etched to define the upper layer of interconnections.

As can be seen from the above description of the alternate preferred embodiment of the process of the present invention, it is not necessary to have the via apertures precisely aligned with respect to the underlying metal topography since the etchant used to create the apertures through the dielectric layer reacts only with this layer and not with the silicon nitride layer or the metal in the metal topography itself. As a result, even if the via apertures 66 are misaligned, the etching will stop on the metal and silicon nitride surfaces thereby preventing defects due to overetching as previously set forth with respect to the other preferred embodiment. Furthermore, using this alternate preferred embodiment of the process, it is not necessary to ensure that the via apertures are smaller than the underlying metal topography as was required in the prior art. Once again this is due to the use of a selective etchant and the appropriate materials as set forth in the aforementioned description whereby the etching process stops at the metal and silicon nitride surfaces and does not continue down past the metal topography through the overhang created by the enlarged via apertures 66 past the underlying metal topography 54.

Figure 5A:
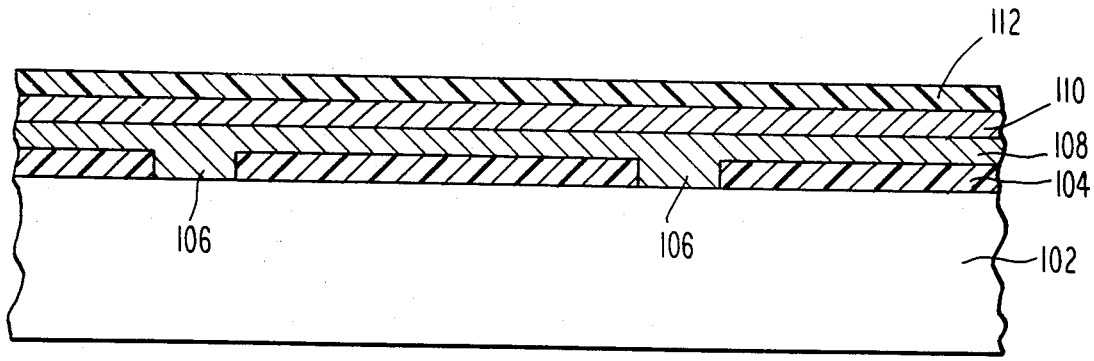
FIGS. 5A through 5F illustrate sequential cross-sectional views of yet another fabrication scheme for an integrated circuit employing another alternate preferred embodiment of the method of the present invention.

Referring now to FIGS. 5A through 5F, there is shown yet another fabrication scheme for multilevel interconnects for integrated circuits employing another alternate preferred embodiment of the method of the present invention. FIG. 5A shows a semiconductor substrate 102 having devices formed therein. A dielectric layer 104 is formed on the surface of the semiconductor substrate 102. It is preferred that the dielectric layer 104 comprise a silicon dioxide material which is formed to a thickness of approximately 7,000 Å preferably by the technique of chemical vapor deposition.

A plurality of apertures 106 are formed in the dielectric layer 104 in predetermined spaced relation to the devices which have been formed in the silicon substrate 102 using any compatible masking technique; for example, optical imaging of a pattern into photoresist. A first metal layer 108 is formed over the dielectric layer 104 and into the apertures 106, preferably using a sputter deposition technique. However, physical vapor deposition or chemical vapor deposition can also be used. It is preferred that the first metal layer 108 comprise aluminum or aluminum alloys and is formed to a thickness substantially equal to 7,500 Å.

Figure 6:
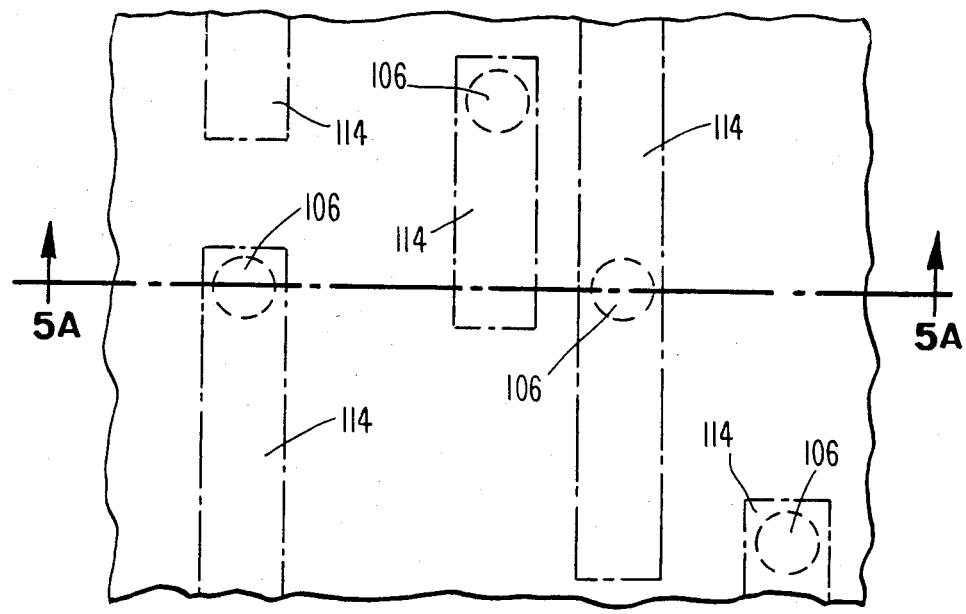
FIG. 6 is a top plan view of a segment of an integrated circuit as depicted in cross-section in FIG. 5A.

A second metal layer 110 is formed over the first metal layer 108 preferably using a sputter deposition technique. However, physical vapor deposition or chemical vapor deposition (CVD) can also be used. It is preferred that the second metal layer 110 comprise tungsten which is formed to a thickness substantially equal to 7,500 Å. A layer of photoresist material 112 is then formed on the second metal layer 110 and is masked and patterned using conventional photoresist techniques to form a pattern of substantially parallel stripes 114 as shown in FIG. 6. The stripe patterns 114 are segmented and disposed on the substrate in predetermined spacial relationship with the apertures 106 because they are used to form a portion of via posts as will be explained in detail later in this specification.

Figure 5B:
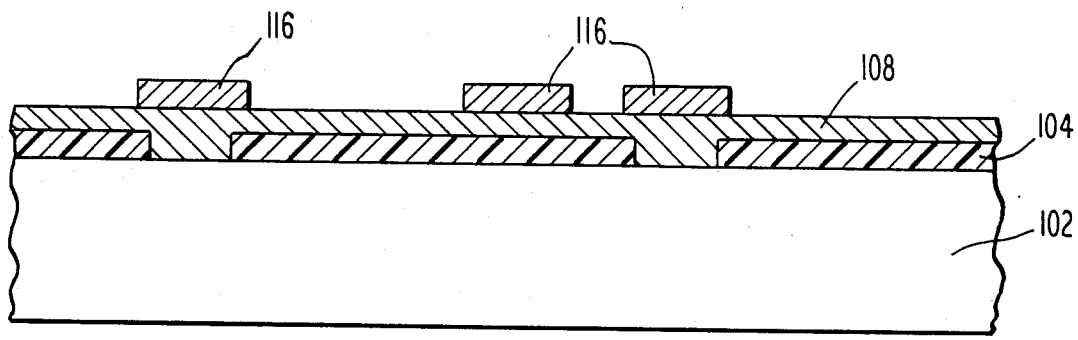
Figure 7:
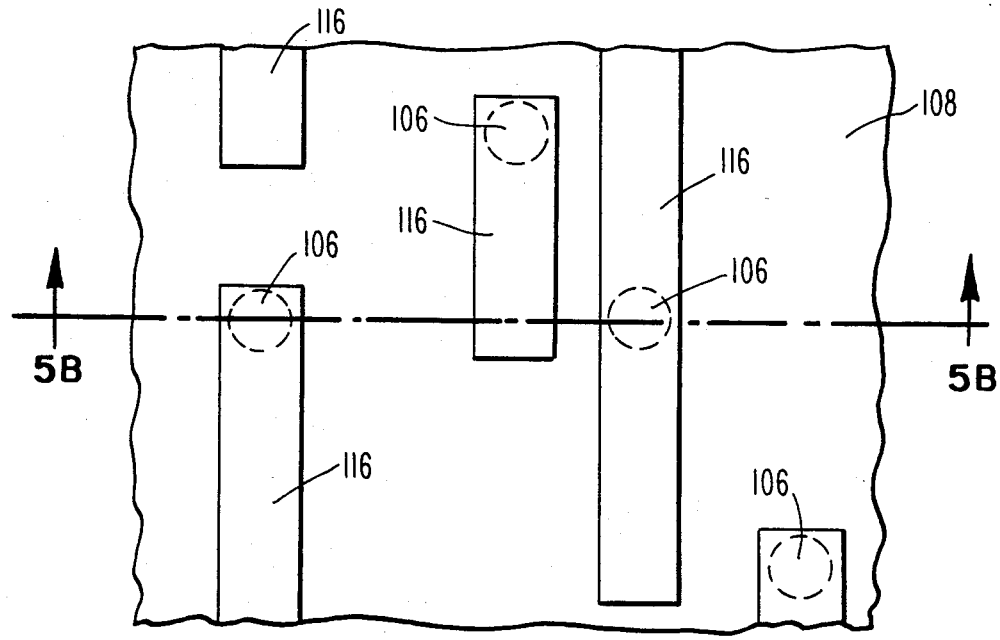
FIG. 7 is a top plan view of a segment of an integrated circuit as depicted in cross-section in FIG. 5B.

The unpatterned photoresist is then developed to expose the second metal layer 110 which is etched down to the top surface of the first metal layer 108 in order to form a plurality of second metal stripes 116 as depicted in FIGS. 5B and 7, using reactive ion etching of tungsten with a fluorine based plasma, which will etch through the second metal 110 but will stop at the first metal 108.

Figure 5C:
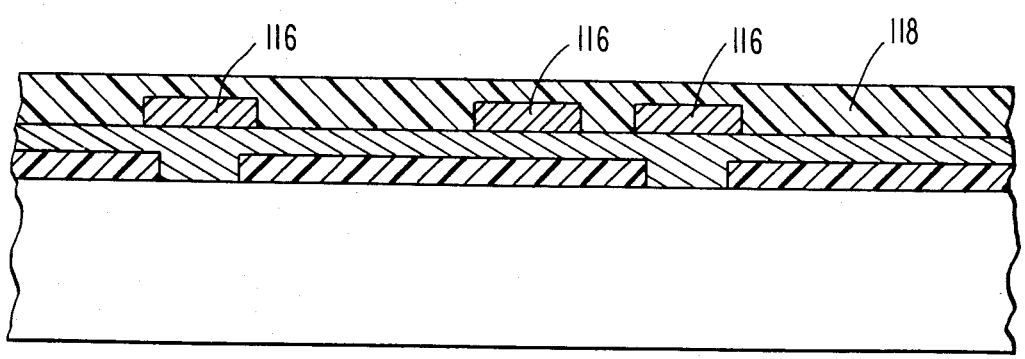
Figure 8:
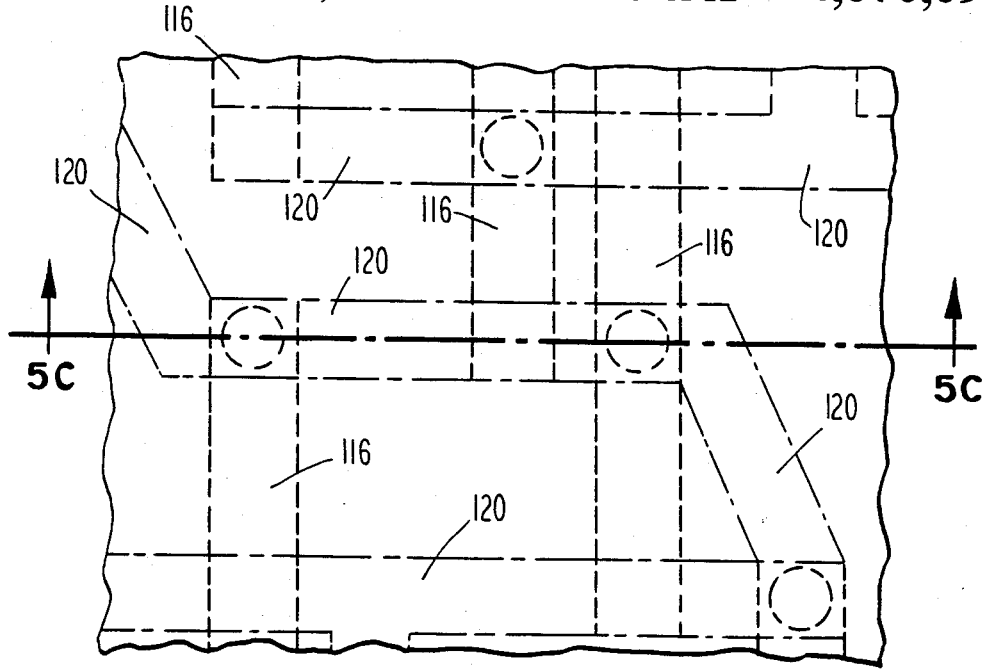
FIG. 8 is a top plan view of a segment of an integrated circuit as depicted in cross-section in FIG. 5C.

Next, as shown in FIG. 5C, a layer of photoresist material 118 is formed over the stripes 116 and first metal layer 108, then is masked and patterned using conventional photoresist techniques to form a pattern of interconnects 120, which pattern intersects the stripe segments 116 in plan view as shown in FIG. 8. These intersections will form posted vias as will be subsequently described.

The unpatterned photoresist material is developed and the exposed second metal areas are etched away down to the surface of the first metal layer 108 using reactive ion etching of tungsten with a fluorine based plasma, which will etch away the second metal but will stop at the first metal.

Figure 5D:
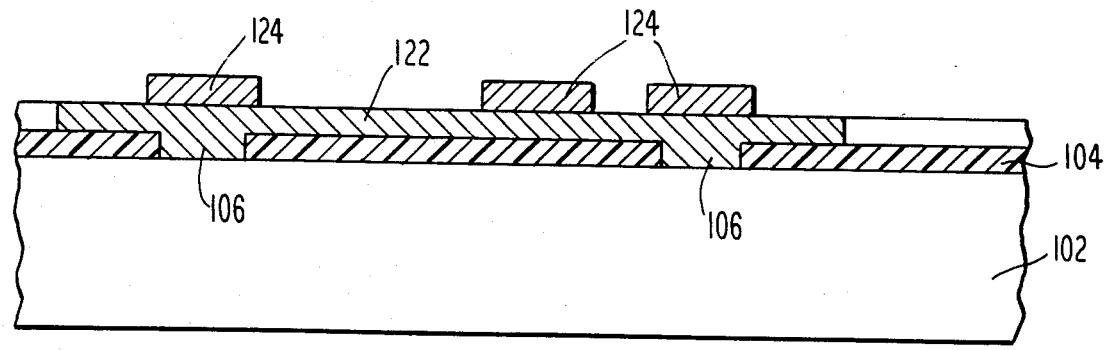

The exposed areas of the first metal layer 108 are then etched using a second etchant which attacks the first metal but does not attack the second metal nor the material comprising the insulating layer 104. Since, in this embodiment, the first metal layer is aluminum or an aluminum alloy, the exposed areas of the first metal layer are etched using a reactive ion etching technique with a chlorine based plasma. As a result of this etching step, an interconnect pattern 122 having posted vias 124 disposed thereon is formed over the insulating layer 104 as depicted in FIGS. 5D and 9.

Figure 9:
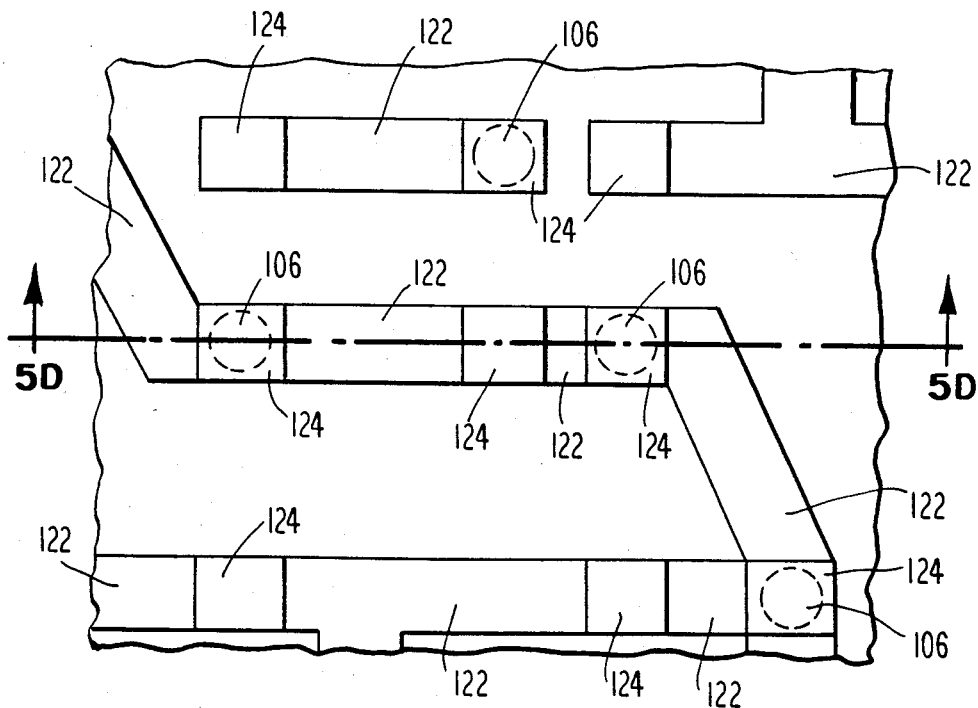
FIG. 9 is a top plan view of a segment of an integrated circuit as depicted in cross-section in FIG. 5D.

As seen in FIG. 9, the posted vias 124 are formed at the intersection of the interconnects 122 with the stripe segments 116. As a result, the posted vias 124 are automatically aligned with the interconnects 122.

Figure 5E:
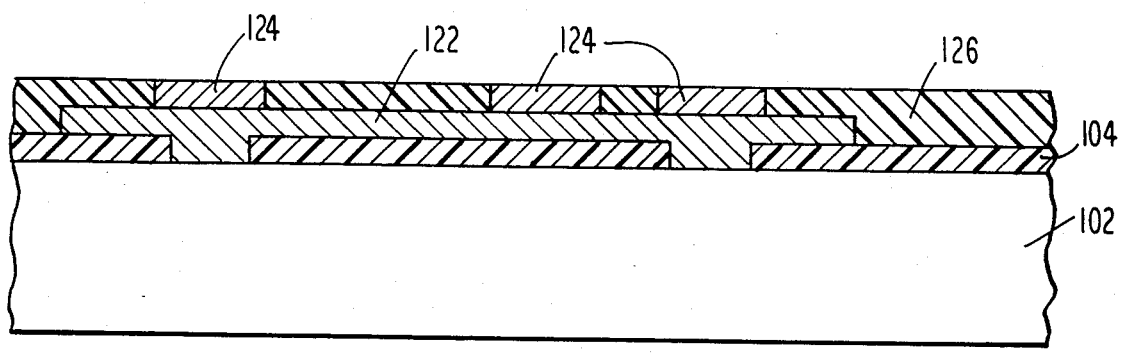
Figure 5F:
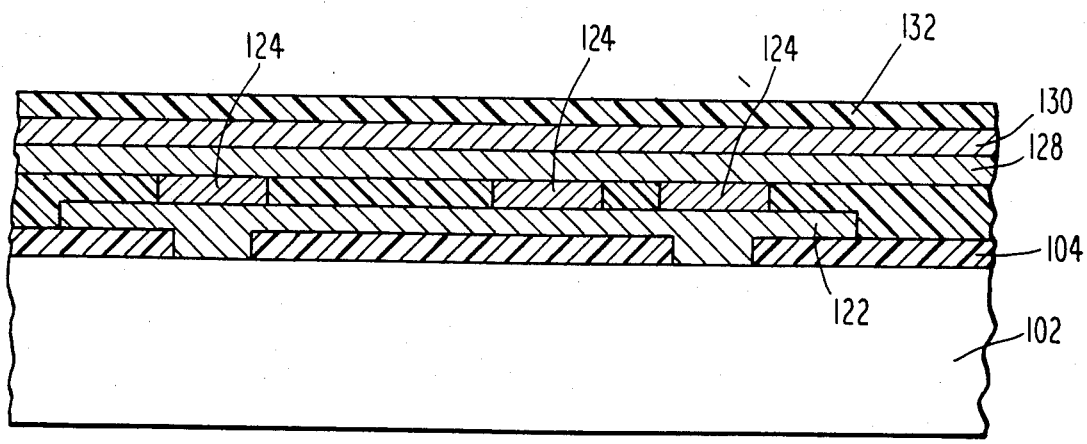

A layer of an insulating material, preferably $SiO_2$ is formed over the interconnects 122 and posted vias 124 using low pressure CVD, to a thickness of preferably 20,000 Å. The insulating layer 126 is then planarized as shown in FIG. 5E using an etchback planarization process which exposes the top surfaces of the posted vias 124 (see also FIG. 10). In order to construct a second level of interconnects, a third metal layer 128, preferably aluminum, is formed over the planarized surface of the second insulating layer 126 and the tops of the posted vias 124, using either sputtering, physical vapor deposition or CVD, to a thickness which is preferably 7,500–12,000 Å. The third metal layer will form electrical contact with the exposed top surfaces of the posted vias 124. If no additional levels are required, the third metal layer is etched into a predetermined interconnect pattern exposed in a layer of photoresist as is known in the art. This final level then can be coated with a dielectric for scratch protection in the conventional manner in order to complete the multilevel structure.

If additional interconnect levels are desired, a fourth metal layer 130 is formed over the third metal layer and a layer of photoresist 132 is formed over the fourth metal layer 130 as set forth above in connection with FIG. 5A. The second level of interconnects as well as a second set of posted vias, for electrically connecting the second level of interconnects to a third level of interconnects, are formed in accordance with the process described above. This process can be repeated until the desired number of interconnect levels has been achieved.

As can be seen from the above description of the additional alternate preferred embodiment of the process of the present invention, the via posts 124 are automatically aligned with the underlying interconnect pattern 122 even if the first mask is not precisely aligned with the second mask since the second metal itself acts as a mask to first metal etching because the posts occur at intersections between the first and second metals.

Referring now to FIGS. 11A through 11D, there is shown yet another fabrication scheme for multilevel interconnects for integrated circuits employing yet another alternate preferred embodiment of the method of the present invention. FIG. 11A shows a semiconductor substrate 502 having devices formed therein. A dielectric layer 504 is formed on the surface of the semiconductor substrate. It is preferred that the dielectric layer 504 comprise a silicon dioxide material which is formed to a thickness of approximately 7,000 Å preferably by the technique of chemical vapor deposition.

A plurality of apertures 506 are formed in the dielectric layer 504 exposing contact regions of the devices which have been formed on the silicon substrate 502. The apertures 506 are formed in the dielectric layer 504 using any compatible masking technique; for example, optical imaging of a pattern into photoresist. A first metal layer 508 is formed over the dielectric layer 504 and into apertures 506, thereby making contact with the device contact regions exposed by the apertures 506. It is also preferred that the first metal layer 508 be formed by using a sputter deposition technique. However, physical vapor or chemical vapor deposition can also be used. It is preferred that the first metal layer 108 comprise aluminum or aluminum alloys and be formed to a thickness to 7,500 Å.

A second metal layer 510 is formed over the first metal layer 508 preferably using a sputter deposition technique. However, physical vapor deposition or chemical vapor deposition (CVD) can also be used. It is preferred that the second metal layer 510 comprise tungsten which is formed to a thickness substantially equal to 7,500 Å. A layer of photoresist material 512 is then formed on the second metal layer 510 and is masked and patterned using conventional photoresist techniques to form a pattern of posts. Those posts which are defined above underlying contact regions, see for example 514 in FIG. 11A, are dimensioned completely and encompass, including misalignment tolerance, the underlying aperture 506 and device contact region.

The unpatterned photoresist is then developed to expose the second metal layer 510 which is etched down to the top surface of the first metal layer 508 in order to form a plurality of posts 516 as depicted in FIGS. 11B and 12, preferably using reactive ion etching of the tungsten with a fluorine based plasma, which will etch through the second tungsten metal layer 510 but will stop at the first aluminum metal layer 108.

Next, as shown in FIG. 11C, a layer of photoresist material 518 is formed over the posts 516 and the first metal layer 508, then is masked and patterned using conventional photoresist techniques to form a pattern 520, as indicated by the dotted lines in FIG. 11C, of interconnects. The unpatterned photoresist material is developed and the exposed first metal areas are etched away down to the surface of the insulating layer 504 using a second etchant which attacks the first metal but does not attack the second metal or the material comprising the insulating layer 504. Since, in this embodiment, the first metal layer is aluminum or an aluminum alloy, the exposed areas of the first metal layer 508 are preferably etched using a reactive ion etching technique with a chlorine based plasma. As a result of this etching step, an interconnect pattern 522 having posts 516 disposed thereon is formed over the insulating layer 504, as depicted in FIGS. 11D and 12. The posts 516 function as masks during the second etching process. Since they completely encompass, including misalignment tolerance, the underlying apertures 506 in the insulating layer 504, and since they do not react with the second etchant, they prevent the second etchant from entering the apertures 506 and possibly exposing or otherwise damaging the device contact regions.

In addition to protecting the underlying apertures and device contact regions, the posts 516 can also serve as via posts by forming a second set of interconnects thereover in accordance with the present invention as previously described in connection with FIGS. 1E through 1H. The number of interconnect levels that can be generated by this method is substantially unlimited and can be used to connect metal layers at any level directly to the substrate by forming posts which are utilized as via posts from the substrate to any desired metal layer.

The final interconnect level can be constructed by forming a single layer of the first metal over the exposed top surfaces of the underlying posts which layer is then etched in accordance with a predetermined pattern exposed in a layer of photoresist as is known in the art. This final level can then be coated with a dielectric for scratch protection in the conventional manner in order to complete the multilevel structure.

Figure 13:
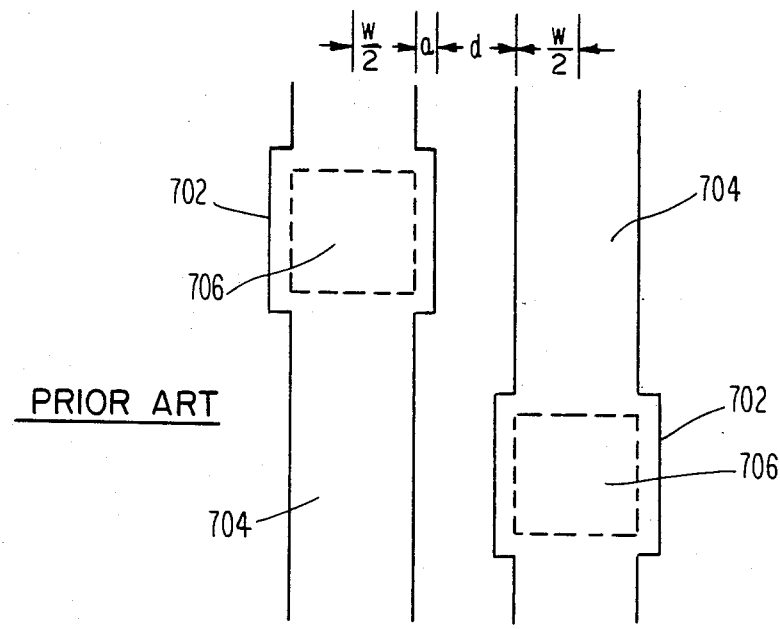
FIG. 13 is a top plan view of a segment of an integrated circuit depicting misalignment tolerance in a prior art fabrication scheme.
Figure 14:
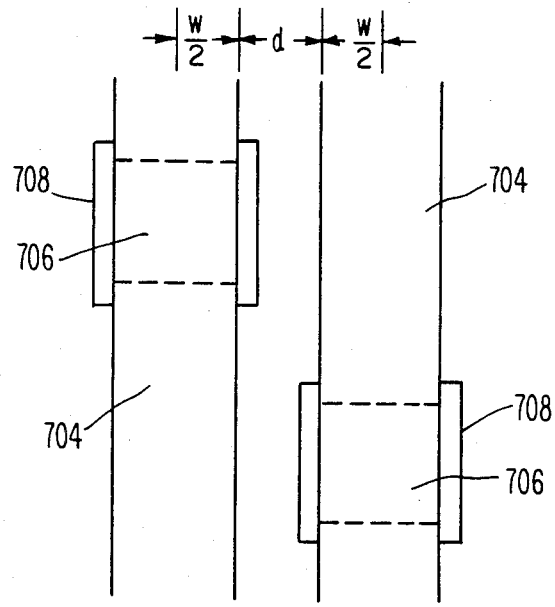
FIG. 14 is a top plan view of a segment of an integrated circuit depicting the illumination of metal to contact misalignment tolerance in accordance with the present invention.

As shown in FIG. 14, when compared with the prior art depicted in FIG. 13, the present invention continues to afford protection of the underlying contact regions while eliminating the need to include the misalignment allowance (a) between the line center to line center spacing thereby enabling the lines to be placed closer together by that amount. At the present time, a typical dimension for intermetal spacing (d) is approximately 2 microns while the misalignment allowance (a) typically equals one-half micron. In a large scale or very large scale integrated device, elimination of the half micron tolerance allowance between each adjacent interconnect line can add up to a significant saving in surface area thereby enabling the incorporation of more devices into the substrate. In addition to permitting closer spacing of the metal lines, use of this method protects the underlying structures from undesired metal etch in the event of misalignment. Furthermore, the posts which are formed to protect underlying contact regions are also useable as via posts and therefore do not add any process complexity.

Another method of protecting against inadvertent etching of underlying contact regions is to provide a thin etch stop layer. For example, a thin layer of titanium, having a thickness of approximately 400 Å is deposited over the exposed underlying contact regions. Next, a second thin layer, for example tungsten having a thickness of approximately 800 Å is formed over the titanium layer. Then, a first metal layer of aluminum is formed over the thin titanium/tungsten layers. This is followed by the formation of a second metal layer, for example, tungsten, over the aluminum layer. Etching of the tungsten and aluminum layers into their predetermined patterns would be performed as previously described. However, the thin titanium/tungsten layers would act as a etch stop against the etchant used to etch the aluminum layer.

Similarly, when using tungsten as the first metal layer and aluminum as the second metal layer, a thin layer of aluminum, for example approximately 300 Å thick, could be utilized between the tungsten layer and the underlying exposed contact regions, as a etch stop layer. In this way, when etching the aluminum and tungsten layers into their predetermined patterns as previously described, the thin aluminum layer will act as an etch stop against the etchant used to etch the overlying tungsten layer.

The final step in both of the above examples is to etch the thin etch stop layers. Although the etchant used to etch the etch stop layers would also etch the posts formed in the second metal layer, the amount of post material lost would be minimal due to the relative thinness of the etch stop layer. Although some post material would be lost, utilizing the thin barrier layer described above significantly reduces the adverse effects of misalignment to underlying contact regions.

While the principles of the present invention have now been made clear in an illustrative embodiment, there will be immediately obvious to those skilled in the art many modifications of structure, arrangement, the elements, material and components used in the practice of the invention and otherwise, which are particularly adapted for specific environments and operating requirements without departing from those principles. The appended claims are, therefore, intended to cover and embrace any such modifications within the limits only of the true spirit and scope of the invention.

We claim:

1. A process for forming vias in an integrated circuit, said process comprising the steps of:
   (a) forming a layer of a first metal on a semiconductor substrate;
   (b) forming a layer of a second metal on said said first metal layer;
   (c) etching said second metal layer in a predetermined via pattern with a second etchant which reacts with said second metal and which is substantially unreactive with said first metal; and
   (d) forming said vias in predetermined spacial relationship with a predetermined interconnect pattern by etching said first metal layer, in said predetermined interconnect pattern, with a first etchant which reacts with said first metal and which is substantially unreactive with said second metal or with said semiconductor substrate 2. The process in accordance with claim 1 wherein said first metal comprises tungsten, said first etchant comprises a fluorine based dry etchant, said second metal comprises aluminum and said second etchant comprises a chlorine base dry etchant.

3. The process in accordance with claim 1 wherein said first metal comprises aluminum, said first etchant comprises a chlorine based dry etchant, said second metal comprises tungsten and said second etchant comprises a fluorine based dry etchant.

4. The process, in accordance with claim 1 for forming vias posts, said process additionally comprising the steps of:
   (e) forming a first dielectric layer on said semiconductor substrate over said interconnects and said posts; and
   (f) forming a substantially planar surface on said first dielectric layer, which surface is substantially coplanar with the upper surfaces of said vias, by etching back said dielectric layer using an etchant which reacts with said dielectric material at an etch rate which is greater than the etch rate at which said etchant reacts with said second metal.

5. The process in accordance with claim 4 wherein said first dielectric layer comprises silicon dioxide and said etchant comprises a fluorine based etchant.

6. The process in accordance with claim 4 additionally comprising the steps of:
   (g) forming a third layer of said first metal on said planar surface;
   (h) etching said third layer in a second predetermined interconnect pattern; and
   (i) forming a layer of dielectric material over said second predetermined interconnect pattern and said first dielectric layer.

7. The process in accordance with claim 4 additional comprising the steps of:
   (g) forming a third layer of said first metal on said planar surface;
   (h) forming a fourth layer of said second metal on said third layer;
   (i) etching said fourth layer in a predetermined via post pattern with an etchant which reacts with said second metal and which is substantially unreactive with said first metal; and
   (j) forming a second set of via posts in predetermined spacial relationship with a second predetermined interconnect pattern by etching said third layer, in said predetermined interconnect pattern, with an etchant which reacts with said first metal and which is substantially unreactive with said second metal or with said dielectric material.

8. The process in accordance with claim 7 additionally comprising the steps of:
   (k) forming a second dielectric layer on said first dielectric layer over said interconnects and vias; and
   (l) forming a substantially planar surface in said second dielectric layer, which surface is substantially co-planar with the upper surfaces of said second set of vias, by etching back said second dielectric layer using an etchant which reacts with said dielectric material at an etch rate which is greater than the etch rate at which said etchant reacts with said second metal.

9. The process in accordance with claim 8 wherein steps (g) through (l) are repeated at least once to form at least a third set of vias and at least a third predetermined interconnect pattern and additionally comprising the steps of:
   (m) forming a top layer of said first metal on the uppermost planar surface;
   (n) etching said top layer in a final predetermined interconnect pattern; and
   (o) forming a top layer of dielectric material over said final predetermined interconnect pattern and the uppermost dielectric layer.

10. A process for fabricating a multilevel integrated circuit, said process comprising the steps of:
    (a) forming a first layer of metal on a semiconductor substrate;
    (b) forming a first level of interconnects in said first metal layer in a first predetermined pattern;
    (c) forming a layer of a first dielectric material on said semiconductor substrate over said first level of interconnects;
    (d) forming a substantially planar surface on said first dielectric layer, which surface is substantially coplanar with the upper surfaces of said first level of interconnects, by etching back said dielectric layer using an etchant which reacts with said dielectric material and not with the interconnect material;
    (e) forming a layer of a second dielectric material on said surface of said first dielectric material over the upper surfaces of said first level interconnects;

(f) etching a predetermined pattern of via apertures in said second dielectric layer, using an etchant which reacts with said second dielectric material and which is substantially unreactive with said first dielectric material and said first level interconnect material;

(g) forming a second layer of metal over said second dielectric material, which layer of metal extends into said via apertures and contacts the upper surfaces of said first level interconnects; and (h) forming a second level of interconnects in said second metal layer in a second predetermined interconnect pattern having predetermined contacting relationship with said first level of interconnects through said via apertures.

11. The process in accordance with claim 10 additionally comprising the step of forming a layer of dielectric material over said second predetermined interconnect pattern and said second dielectric material.

12. The process in accordance with claim 10 wherein steps (c) through (h) are repeated at least once to form at least a third level of interconnects in predetermined contacting relationship with said second level of interconnects and additionally comprising the step of forming a top layer of dielectric material over said final level of interconnects.

13. A process for forming vias in an integrated circuit, said integrating circuit including at least one insulating layer having an exposed contact region formed therein, said process comprising the steps of:

(a) forming a layer of a first metal on said insulating layer and into contact with said exposed contact region;

(b) forming at layer of a second metal on said first metal layer;

(c) etching said second metal layer, with a second etchant which reacts with said second metal and which is substantially unreactive with said first metal, in a predetermined via pattern with at least one via having an area which is at least substantially equal to the area of an underlying contact region and which is substantially aligned therewith in covering spacial relationship thereto;

(d) forming said vias in predetermined spacial relationship with a predetermined interconnect pattern by etching said first metal layer, in said predetermined interconnect pattern, with a first etchant which reacts with said first metal and which is substantially unreactive with said second metal or with said semiconductor substrate.

14. The process in accordance with claim 13 additionally comprising the steps of:

(e) forming a first dielectric layer over said interconnects and said vias; and (f) forming a substantially planar surface on said first dielectric layer, which surface is substantially co-planar with the upper surfaces of said vias, by etching back said dielectric layer until at least the upper surface of said vias are exposed, using an etchant which reacts with said dielectric material at an etch rate which is greater than the etch rate at which said etchant reacts with said second metal, said exposed upper surfaces forming via contact regions.

15. The process in accordance with claim 14 additionally comprising the steps of:

(g) forming a third layer of said first metal on said planar surface in contact with said via contact regions;

(h) etching said third layer in a second predetermined interconnect pattern; and (i) forming a layer of dielectric material over said second predetermined interconnect pattern and said first dielectric layer.

16. The process in accordance with claim 14 additionally comprising the steps of:

(g) forming a third layer of said first metal on said planar surface in contact with said via contact region;

(h) forming a fourth layer of said second metal on said third layer;

(i) etching said fourth layer, with said second etchant, in a predetermined via pattern with at least one via having an area which is at least substantially equal to the area of an underlying via contact region and which is substantially aligned therewith in covering spacial relationship thereto; and (j) forming a second set of vias in predetermined spacial relationship with a second predetermined interconnect pattern by etching said third layer, in said predetermined interconnect pattern, with said etchant.

17. The process in accordance with claim 16 additional comprising the steps of:

(k) forming a second dielectric layer on said first dielectric layer over said interconnects and said vias; and (l) forming a substantially planar surface on said second dielectric layer, which surface is substantially co-planar with the upper surfaces of said vias, by etching back said dielectric layer until at least the upper surface of said vias are exposed, using an etchant which reacts with said dielectric material at an etch rate which is greater than the etch rate at which etchant reacts with second metal, said exposed upper surfaces forming via contact regions.

18. The process in accordance with claim 17 wherein steps (g) through (l) are repeated at least once to form at least a third set of vias and at least a third predetermined interconnect pattern and additionally comprising the steps of:

(m) forming a top layer of said first metal on the uppermost planar surface;

(n) etching said top layer in a final predetermined interconnect pattern; and (o) forming a top layer of dielectric material over said final predetermined interconnect pattern and the uppermost dielectric layer.

19. A process of forming vias in an integrated circuit, said process comprising the steps of:

(a) forming a first layer of a first metal on a semiconductor substrate;

(b) forming a second layer of a second metal on said first metal layer;

(c) etching a predetermined interconnect pattern in said second metal layer with a second etchant which reacts with said second metal and which is substantially unreactive with said first metal;

(d) etching said first metal layer in said predetermined interconnect pattern with a first etchant which reacts with said first metal and which is substantially unreactive with said second metal and with said material which underlies said first metal layer;

(e) etching a predetermined pattern of vias in said second metal layer with a second etchant which reacts with said second metal and which is substantially unreactive with said first metal and said underlying material.

20. A process of forming vias in an integrated circuit, said process comprising the steps of:
(a) forming a first layer of a first metal on a semiconductor substrate;
(b) forming a second layer of a second metal on said first metal layer;
(c) etching said second metal layer in a predetermined pattern with a second etchant which reacts with said second metal and which is substantially unreactive with said first metal;
(d) etching a predetermined interconnect pattern in said second metal layer with said second etchant whereby vias are formed at the 15 intersections of said pattern and said predetermined interconnect pattern;
(e) etching said first metal layer in said predetermined interconnect pattern with a first etchant which reacts with said first metal and which is substantially unreactive with said second metal and with said material which underlies said first metal layers.

* * * * *

UNITED STATES PATENT AND TRADEMARK OFFICE
CERTIFICATE OF CORRECTION

PATENT NO. : 4,670,091

DATED : June 2, 1987

INVENTOR(S) : Michael E. Thomas et al

It is certified that error appears in the above-identified patent and that said Letters Patent is hereby corrected as shown below:

Column 1, line 37, delete the word "aligment" and replace with the word "alignment".

Column 1, line 38, delete the word "citical" and replace with the word --critical--.

Column 2, line 12, delete the word "the", third occurrence.

Column 2, line 54, add a period (--.--) after the word "structures".

Column 5, line 14, delete the word "Eve" and replace with the word --Even--.

Column 6, line 27, delete ". A".

Column 10, line 48, add a comma (--,--) between "$\overset{o}{A}$" and "is".

In the Abstract: Line 10, delete the word "substantialy" and replace with the word --substantially--.

UNITED STATES PATENT AND TRADEMARK OFFICE
CERTIFICATE OF CORRECTION

PATENT NO. : 4,670,091

DATED : June 2, 1987

INVENTOR(S) : Michael E. Thomas et al

It is certified that error appears in the above-identified patent and that said Letters Patent is hereby corrected as shown below:

Claim 1, at column 11, line 28, delete the word "said", second occurrance.

Claim 1, at column 11, line 40, add a period (--.--) after the word "substrate".

Claim 13, at column 13, line 35, delete the word "at" and replace with the article "a".

Claim 20, at column 16, line 5, delete the number "15".

Signed and Sealed this

Seventeenth Day of November, 1987

Attest:

DONALD J. QUIGG

*Attesting Officer*  *Commissioner of Patents and Trademarks*